United States Patent

Allis et al.

Patent Number: 5,680,086
Date of Patent: Oct. 21, 1997

[54] MRI MAGNETS

[75] Inventors: Jonathan Leslie Allis, Iffley; Alan George Andrew, Bladon; Robin Thomas Elliott, Wantage; Michael Ben Sellers, Witney, all of England

[73] Assignee: Oxford Magnet Technology Limited, Witney, England

[21] Appl. No.: 305,867

[22] Filed: Sep. 14, 1994

[30] Foreign Application Priority Data

Sep. 29, 1993 [GB] United Kingdom ............ 9320043
Sep. 1, 1994 [GB] United Kingdom ............ 9417541

[51] Int. Cl.⁶ ........................................... H01F 1/00
[52] U.S. Cl. ........................ 335/296; 335/216; 324/318
[58] Field of Search ........................ 335/216, 296, 335/298; 324/318, 319, 320, 321, 322

[56] References Cited

U.S. PATENT DOCUMENTS

| | | |
|---|---|---|
| 4,827,235 | 5/1989 | Inomata et al. . |
| 5,124,651 | 6/1992 | Danby et al. . |
| 5,166,619 | 11/1992 | Ries . |
| 5,202,305 | 4/1993 | Watanabe et al. ............ 505/1 |
| 5,317,297 | 5/1994 | Kaufman et al. . |
| 5,495,171 | 2/1996 | Danby et al. ............ 324/318 |

FOREIGN PATENT DOCUMENTS

| | | |
|---|---|---|
| 0284439 | 9/1988 | European Pat. Off. . |
| 0407227 | 1/1991 | European Pat. Off. . |
| 0432750 | 6/1991 | European Pat. Off. . |
| 0479514 | 4/1992 | European Pat. Off. . |
| 3719306 | 12/1988 | Germany . |
| 1104252 | 4/1989 | Japan . |
| 2246927 | 10/1990 | Japan . |
| 4196109 | 7/1992 | Japan . |
| 91/14948 | 10/1991 | WIPO . |

Primary Examiner—Lincoln Donovan
Attorney, Agent, or Firm—Keck, Mahin & Cate

[57] ABSTRACT

A magnetic resonance imaging (MRI) magnet comprising opposing pole pieces which define between them an imaging volume, the pole pieces comprising pole plates which are fabricated from wound high permeability soft magnetic material.

17 Claims, 2 Drawing Sheets

MRI MAGNETS

This invention relates to magnetic resonance imaging (MRI) magnets.

Magnetic resonance imaging requires that an object to be imaged is placed in a magnetic field homogeneous to a few tens of parts per million. High magnetic fields ($\geq 0.5$ T) are typically produced in cylindrical super conducting electromagnets. For lower fields ($\leq 0.3$ T) a permanent magnet or a 'resistive' electromagnet is sufficient. The present invention is concerned more especially with these latter kinds of magnet having opposing pole pieces, such as the so called 'H' and 'C' magnets, wherein an imaging volume is defined between the opposing pole pieces.

As is well known to those skilled in the art the imaging process requires that linear magnetic field gradients are pulsed on and off to provide spatial frequency and phase encoding which is necessary to generate an image. These linear magnetic field gradients are generated by gradient coils which are typically an assembly of electrical conductors, the precise geometry of which defines the orientation of the magnetic field gradient produced and when the gradient coils are pulsed current changes of between 60 to 100 amps are typically produced in 1 msec. One of the problems with this imaging process is that hysteresis and eddy current effects are produced in the pole pieces, which can spoil the stability and/or homogeneity of the magnetic field over the imaging volume and this leads to degradation of image quality.

One known method of reducing these undesirable effects is to actively shield coils provided to produce the magnetic field gradients and this is achieved by designing the coils so that they comprise layers of conductors with currents flowing in opposite directions so that a magnetic field in pole plates provided on the opposing pole pieces is as close to zero as possible. This method usually requires air or water cooling due to increased electrical power which leads to an increase in the capital and running costs of a magnet system.

An alternative approach is to choose a pole plate material having low coercivity and low conductivity whereby the hysteresis and eddy current problem would be substantially obviated. Hitherto, various materials and types of construction have been proposed for pole plate construction comprising interalia, the use of ferrites or horizontally disposed Silicon Iron laminates (i.e. pole plates fabricated of stacked discs of Silicon Iron which afford lamination in a direction orthogonal to the longitudinal axis of the pole pieces). Hitherto, all of these proposed constructional arrangements have had significant disadvantages and the suppression of the one source of image degradation can lead to the introduction of other problems.

Thus, if for example, pole plates are fabricated from small ferrite blocks having low conductivity so as to produce small eddy currents, the coercivity is high which leads to large hysteresis effects. Similarly, by using horizontally disposed laminates which may be fabricated from Silicon Iron, ultra pure Iron or Nickel-Iron alloys, varying amounts of eddy currents and hysteresis result which are undesirable for high quality image production. Moreover, high permeability materials, such as Nickel-Iron, present in horizontal laminates, develop a large radial magnetisation and thus magnetic saturation or partial saturation of the material can result which produces non-linear magnetic effects which reduce magnetic stability and/or degrade image quality.

It has also been proposed in known arrangements to use vertical laminations across the pole plate, consisting of a very large number of flat planar strips. However it is necessary to employ two such sets of laminations orthogonal to each other, which results in a structure which is difficult and expensive to manufacture.

It is the object of the present invention therefore, to provide an MRI magnet wherein the foregoing problems are substantially obviated whereby high quality image production is facilitated.

According to the present invention a magnetic resonance imaging (MRI) magnet comprises opposing pole pieces which define between them an imaging volume, the pole pieces comprising pole plates which are fabricated from radially laminated high permeability soft magnetic material whereby eddy current and hysteresis effects which spoil the stability of the magnetic field in the imaging volume and which lead to degradation of imaging quality are substantially reduced.

The laminations of the said material may be mutually insulated one from another.

The efficiency of insulation required is not especially great, as with ordinary transformer laminations, but in general the ratio of radial to circumferential resistance between adjacent laminations should be significant, i.e. greater than about 1.

The pole plates may conveniently be fabricated from wound material such that turns of the winding define in effect the laminations.

Although winding is an eminently convenient method of fabrication, other fabrication techniques are possible, such as for example, the use of mutually insulated concentric rings of suitable material which may be produced using plating techniques.

The said material may conveniently comprise strip material which is wound to produce pole plates the thickness of which corresponds to the width of the strip. Alternatively however, insulated wire may be used which is preferably of square or rectangular cross-section.

The high permeability soft magnetic material may be Silicon Iron (SiFe), Nickel Iron (NiFe), Permendur (FeCoV), or other low coercivity material.

The pole plates may be fabricated from any commercially available strip thickness, but are preferably fabricated from strip material which is 0.025 mm to 1.0 mm in thickness.

The pole pieces may each comprise a pole shoe and a gradient coil assembly, the pole shoes being linked by a yoke of magnetic material which provides a magnetic flux return path, the pole plate of each pole piece being positioned between an associated pole shoe and an associated gradient coil assembly so that the imaging volume lies contiguously between the gradient coil assemblies.

The yoke may define a 'C' magnet or alternatively it may define an 'H' magnet or it may comprise a plurality of parallel flux return paths which define some other configuration.

The magnet may be a permanent magnet wherein the yoke comprises permanent magnetic material or alternatively it may be a resistive electro-magnet wherein the yoke is embraced by a coil which is arranged to carry a magnetising current.

In order to provide for magnetic field shaping, shims of magnetic material may be positioned between the pole plate and the pole shoe of each pole piece.

The shims may comprise flat iron annuli supported on or in a non-magnetic carrier which may be a non-conductive plastics material such as perspex for example.

Alternatively or additionally, magnetic field shaping may be achieved by means of a plurality of relatively small permanent magnets positioned between the pole plate and the gradient coil assembly of each pole piece, and/or by profiling at least one surface of each pole plate.

The gradient coils of the magnet may be fabricated so as to afford active shielding, as aforesaid in accordance with any known technique.

The strip material from which the pole plate is made may be grain oriented along its length, thereby to provide enhanced permeability along the strip and azimuthally through the thickness of the plate.

The thickness of insulation between turns of the wound pole plates may be such as to afford a packing density of about 70% or more.

One embodiment of the invention will now be described by way of example only with reference to the accompanying drawings, wherein, FIG. 1 is a sectional side view of an 'H' magnet;

FIG. 3b is a sectional side view of the plate shown in FIG. 3a;

Figure 3A:
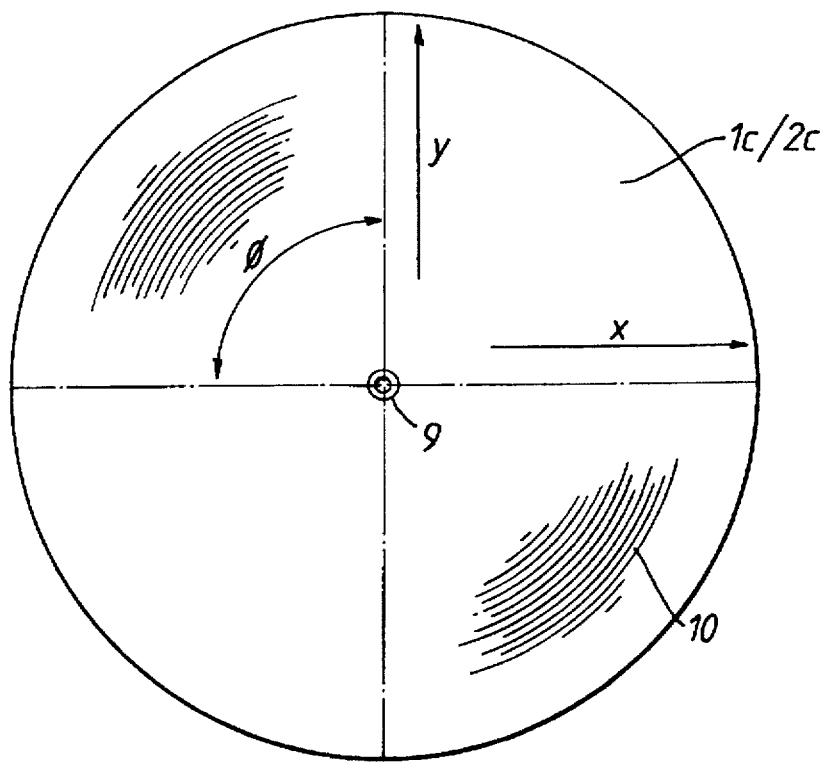
FIG. 3a is a plan view of a pole plate which forms a part of the magnets shown in FIGS. 1 and 2.
Figure 3B:
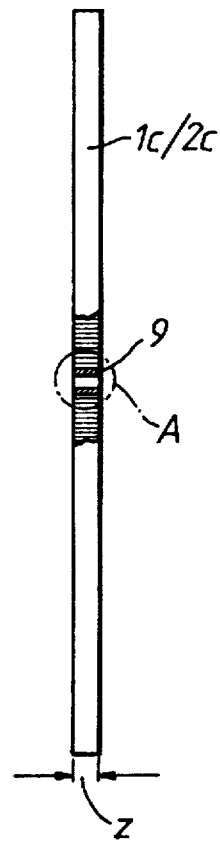
Figure 3C:
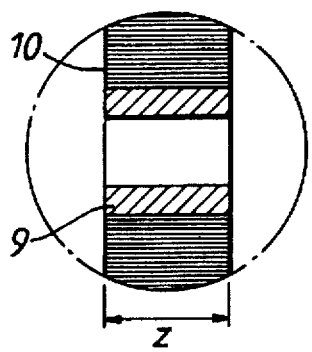

and FIG. 3c i an enlargement of a part of the side view shown in FIG. 3b.

Figure 1:
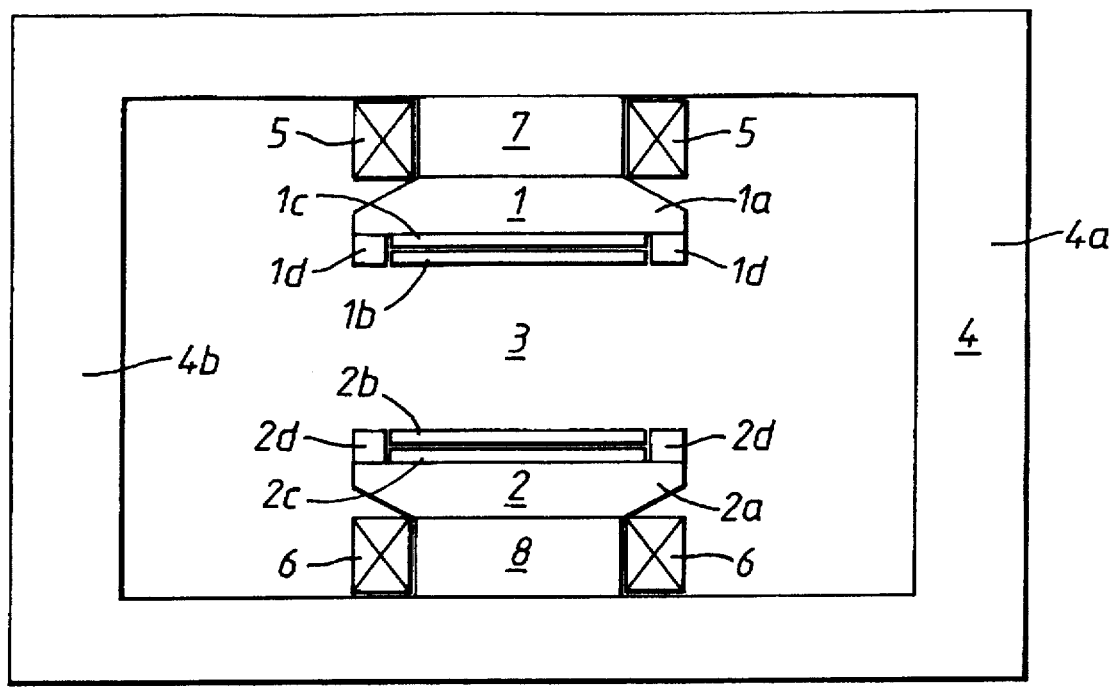
Figure 2:
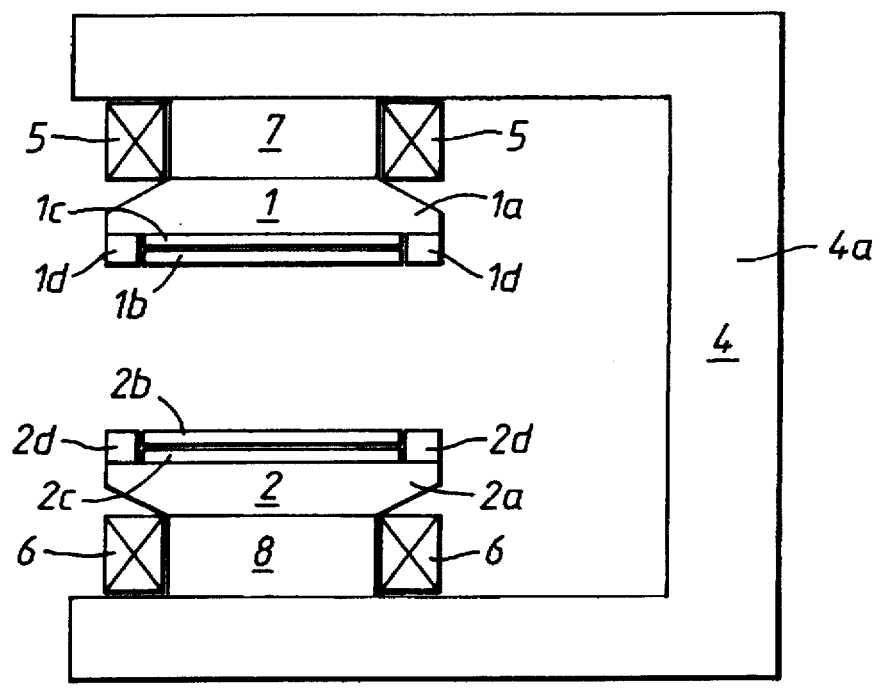
FIG. 2 is a sectional side view of a 'C' magnet.

Referring now to FIG. 1 and FIG. 2, wherein corresponding parts bear the same numerical designations, a magnet comprises a pair of juxtaposed pole pieces 1 and 2 which define between them an imaging volume 3. The pole pieces 1 and 2 are magnetically coupled by means of a yoke 4 which in the case of an 'H' magnet, as shown in FIG. 1, comprises two limbs 4a and 4b connected magnetically in parallel and in the case of a 'C' magnet, as shown in FIG. 2, comprises a single limb 4a only.

Magnetic flux which is carried by the yoke 4 is generated by annular windings 5 and 6 which embrace yoke core portions 7 and 8 respectively to which the pole pieces 1 and 2 respectively are connected. The pole piece 1 comprises a pole shoe 1a, a gradient coil assembly 1b and a pole plate 1c, which pole plate 1c is sandwiched between the pole shoe 1a and the gradient coil assembly 1b. The pole shoe 1a is effectively peripherally extended in the axial direction by means of a pole edge shim 1d, thereby to define a generally cylindrical space within which the pole plate 1c and the gradient coil assembly 1b are fitted. The juxtaposed pole piece 2 is similarly constructed and comprises a pole shoe 2a, a gradient coil assembly 2b, a pole plate 2c and a pole edge shim 2d.

In order to minimise the effects of hysteresis and eddy currents, the pole plates 1c and 2c, shown in FIGS. 1 and 2, are fabricated from Silicon Iron strip which is preferably grain oriented along its length and which, as shown in FIGS. 3a, 3b and 3c, is wound on a mandrel 9 to produce a pole plate which comprises a plurality of radial laminations 10, each lamination being defined by one turn of the Silicon Iron strip. In order to minimise eddy current effects, the turns may be insulated from each other by an insulative coating carried by the strip, and the completed winding is impregnated with an epoxy resin or some other suitable impregnant. Using this method of construction, stacking factors (i.e. the ratio in a radial direction of metal to insulation) of about 95% are achievable and in practice it has been found that satisfactory results can be achieved provided the stacking factor is better than about 70%.

Eddy current effects can also be minimised by means of radial cuts through the pole plate which may, or may not, be continuous across the diameter of the plate. These cuts can number from one to eight without compromising the plate stacking factor.

By winding the pole plates 1c and 2c using Silicon Iron strip which should preferably be between 0.025 mm to 1.0 mm in thickness, eddy currents and hysteresis problems due to gradient fields in the x and y directions, as shown in FIG. 3a, are minimised. A key to understanding the behaviour of the strip wound plates 1c and 2c is in the extreme anisotropy of both its magnetic permeability and conductivity. In the axial (z) and azimuthal ($\phi$) directions the permeability to magnetic flux is the same as for bulk Silicon Iron with similar grain orientation. In the radial direction however, the presence of the laminations reduces the permeability to a fraction of its bulk value. This reduces the radial flux in the pole plate due to the main magnet and thus eliminates magnetic saturation effects.

The gradient flux for gradient fields in the x and y directions is carried azimuthally within individual strips of the wound pole plate. If the strip thickness is less than the skin depth for the highest frequency in a gradient pulse, no eddy current is detectable. Experimentally it has been found that a pole plate made from 30 mm wide Silicon Iron strip, which is 0.35 mm thick produces an eddy current of less than 1% for the x and y gradients compared to an eddy current exceeding 10% for a pole plate made from similar material, but laminated in the plane of the pole shoe, i.e. normally the horizontal plane. The eddy current due to the axial (z) gradient is not reduced to the level of those induced by the transverse gradients, since magnetic flux due to the axial gradient passes through the pole plate and generates eddy currents in the underlying pole shoe.

The alternating magnetic flux due to the axial gradient coil induces a voltage between adjacent turns of the strip-wound pole plate, the pole plate/axial gradient coil behaving much like a transformer. The transformer analogy reveals that very large voltages, of the order of many tens of kilovolts, can be induced from one part of the pole plate to another. This can lead to voltage breakdown between the pole plate and the rest of the magnet. This problem may be remedied by winding the pole plate non-inductively, for example, by reversing the direction of winding many times during the winding process, or by ensuring that there is some residual conductivity between adjacent strips of the pole plate. In practice this occurs naturally unless a specifically thickened glue is used, or an insulating layer is inserted between adjacent strips. The presence of these shorts does not affect the x or y gradient performance, but does produce a large 'eddy current' in response to pulsing of the z gradient axis. Winding the pole plate from a multifilar assembly of strips would also serve to reduce the maximum voltage induced from one part of the pole plate to another.

One approach to eliminating both the eddy current and voltage problem, is to actively shield the axial gradient only, resulting in a 'hybrid active shield' gradient set, where the x and y gradients remain unshielded.

In order to eliminate turn-to-turn shorts in the plates 1c/2c which can occur between adjacent turns and allow large axial eddy currents to flow, an insulating layer between the rums of Silicon Iron, the thickness of which is about 50 micron may be provided, but the insulation efficiency does not need to be any better than in conventional transformers between laminations allowing the use of readily available coated strip material.

The large axial and small radial permeability of the plate implies that magnetic flux penetrates more deeply in the axial direction within the plate than it would penetrate into an anisotropic or horizontally laminated plate. This serves to decrease the magnetic flux density in the plate due to the gradient, reducing the size of B-H loop traversed during any gradient pulse, and thereby reducing the measured hysteresis effect in the plate to less than a tenth of that measured in an isotropic or horizontally laminated plate. It has been found experimentally that the hysteresis falls as the thickness of the Silicon Iron plates increases. If the plates 1c/2c were made of a low coercivity material, such as a Nickel Iron alloy (Permalloy) their thickness could be reduced without any increase in hysteresis.

The low radial permeability of the plates 1c and 2c implies that the strip wound construction facilitates the unadulterated transmission of a large proportion of the flux incident on it and so magnetic field shaping or shimming may be performed between the plate and the pole shoe by the inclusion of the iron shims in this space or by profiling the surface of the pole plate which faces the adjacent pole shoe. If an isotropic or horizontally laminated plate were used, the incident flux direction and magnitude would be radically altered by the plate, implying that any magnetic field shaping should be done on the surface of the plate closest to the imaging volume, whereas with the strip wound plate, although shimming may conveniently be done on this side of the plate, satisfactory results may be achieved by shimming on either side. However, the surface of the plates adjacent to the gradient coils is probably the most convenient for the attachment of shimming magnets.

Various modifications may be made to the arrangement just before described without departing from the scope of the invention and for example, the yoke 4 may comprise permanent magnetic material whereby the energising windings 5 and 6 are not required. Moreover, although in FIGS. 1 and 2, 'H' and shaped yoke constructions respectively are shown, it will be well understood that other arrangements are possible which would provide a suitable return path for the magnetic flux. Additionally, although a pole plate is most conveniently fabricated using strip wound material, the use for some applications of wire which is preferably of square/rectangular cross-section, so as to achieve good stacking factors, is envisaged.

We claim:

1. A magnetic resonance imaging (MRI) magnet comprising:

pole pieces which define between them an imaging volume, the pole pieces comprising pole plates fabricated from radially laminated high permeability soft magnetic material, a pole shoe and a gradient coil assembly, and a yoke of magnetic material linking the pole shoes and providing a magnetic flux return path, the pole plate of each pole piece being positioned between an associated pole shoe and an associated gradient coil assembly so that the imaging volume lies contiguously between the gradient coil assemblies, each gradient coil assembly being fabricated so as to afford active shielding of its axial gradient only and to leave its transverse gradient unshielded.

2. A magnet as claimed in claim 1, wherein laminations of said material are mutually insulated one from another.

3. A magnet as claimed in claim 1, wherein said pole pieces are opposing pole pieces and turns of the material are mutually insulated one from another.

4. A magnet as claimed in claim 3, wherein the material comprises strip material which is wound to produce said pole plates the thickness of which corresponds to the width of the strip material.

5. A magnet as claimed in claim 3, wherein the high permeability soft magnetic material is Silicon Iron (SiFe).

6. A magnet as claimed in claim 3, wherein the high permeability soft magnetic material is Nickel-Iron alloy.

7. A magnet as claimed in claim 4, wherein the pole plates are fabricated from strip material which is 0.025 mm to 1.0 mm in thickness.

8. A magnet as claimed in claim 4, wherein interturn insulation is facilitated by utilising a bifilar construction, in which material possessing a high dielectric property is wound together with the said strip material.

9. A magnet as claimed in claim 1, wherein the pole plate is arranged to include a plurality of substantially radially disposed cuts which extend there through and which serve to reduce eddy currents.

10. A magnet as claimed in claim 1, wherein the magnetic material is a resistive electro-magnet and the yoke is embraced by a coil which is arranged to carry a magnetising current.

11. A magnet as claimed in claim 1, wherein the magnetic material is a permanent magnet.

12. A magnet as claimed in claim 1, and further comprising shims of magnetic material positioned adjacent the pole plates and the pole shoes of the pole pieces.

13. A magnet as claimed in claim 1, and further comprising ferromagnetic material on at least one surface of the pole plate.

14. A magnet as claimed in claim 1, and further comprising a plurality of relatively small permanent magnets positioned between the pole plate and the gradient coil assembly of each pole piece.

15. A magnet as claimed in claim 1, wherein at least one surface of the pole plates is profiled.

16. A magnet as claimed in claim 1, wherein active shielding for all three gradient axes is provided.

17. A magnet as claimed in claim 4, wherein the strip material from which the pole plates are made is grain oriented.

* * * * *